United States Patent
Campardo et al.

(10) Patent No.: US 6,947,329 B2
(45) Date of Patent: Sep. 20, 2005

(54) METHOD FOR DETECTING A RESISTIVE PATH OR A PREDETERMINED POTENTIAL IN NON-VOLATILE MEMORY ELECTRONIC DEVICES

(75) Inventors: Giovanni Campardo, Bergamo (IT); Rino Micheloni, Turate (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 14 days.

(21) Appl. No.: 10/675,805

(22) Filed: Sep. 30, 2003

(65) Prior Publication Data

US 2004/0223399 A1 Nov. 11, 2004

(30) Foreign Application Priority Data

Sep. 30, 2002 (EP) ............................................. 02425593

(51) Int. Cl.[7] .............................................. G11C 16/04
(52) U.S. Cl. .............................. 365/185.26; 365/185.2; 365/189.07; 365/200
(58) Field of Search ........................ 365/185.28, 185.2, 365/189.07, 200, 210

(56) References Cited

U.S. PATENT DOCUMENTS

| | | | |
|---|---|---|---|
| 4,538,245 A | 8/1985 | Smarandoiu et al. ........ | 365/200 |
| 5,077,691 A | 12/1991 | Haddad et al. .............. | 365/218 |
| 5,233,559 A | 8/1993 | Brennan, Jr. ................. | 365/200 |
| 5,262,993 A | 11/1993 | Horiguchi et al. ........... | 365/200 |
| 5,265,055 A | 11/1993 | Horiguchi et al. ........... | 365/200 |
| 5,347,489 A | 9/1994 | Merchant et al. ............ | 365/203 |
| 5,418,752 A | 5/1995 | Harari et al. ................. | 365/218 |
| 5,452,251 A * | 9/1995 | Akaogi et al. ............... | 365/200 |
| 5,618,742 A | 4/1997 | Shone et al. ................. | 438/263 |
| 5,659,550 A | 8/1997 | Mehrotra et al. ........... | 371/21.4 |
| 5,724,297 A | 3/1998 | Noda et al. .................. | 365/226 |
| 5,862,080 A | 1/1999 | Harari et al. ........... | 365/185.29 |
| 5,978,264 A * | 11/1999 | Onakado et al. ........ | 365/185.11 |
| 6,304,488 B1 | 10/2001 | Abedifard et al. ...... | 365/185.23 |
| 6,532,181 B2 * | 3/2003 | Saito et al. .................. | 365/200 |
| 6,553,510 B1 * | 4/2003 | Pekny ............................ | 714/6 |

FOREIGN PATENT DOCUMENTS

| | | |
|---|---|---|
| EP | 0 797 145 A1 | 9/1997 |
| EP | 1 126 372 A1 | 8/2001 |

* cited by examiner

Primary Examiner—Son T. Dinh
(74) Attorney, Agent, or Firm—Lisa K. Jorgenson; David V. Carlson; SEED IP Law Group PLLC (57) ABSTRACT

The invention relates to a method for pinpointing erase-failed memory cells and to a relevant integrated non-volatile memory device, of the programmable and electrically erasable type comprising a sectored array of memory cells arranged in rows and columns, with at least one row-decoding circuit portion per sector being supplied positive and negative voltages. This method becomes operative upon a negative erase algorithm issue, and comprises the following steps: forcing the read condition of a sector that has not been completely erased; scanning the rows of said sector to check for the presence of a spurious current indicating a failed state; finding the failed row and electrically isolating it for re-addressing the same to a redundant row provided in the same sector.

15 Claims, 8 Drawing Sheets

METHOD FOR DETECTING A RESISTIVE PATH OR A PREDETERMINED POTENTIAL IN NON-VOLATILE MEMORY ELECTRONIC DEVICES

CROSS-REFERENCE TO RELATED APPLICATION

This application relates to U.S. patent application Ser. No. 10/675221, Attorney Docket No. 856063.745, being filed concurrently, entitled METHOD FOR ERASING NON-VOLATILE MEMORY CELLS AND CORRESPONDING MEMORY DEVICE, which application is incorporated herein by reference in its entirety.

BACKGROUND OF THE INVENTION

1. Field of the Invention

The present invention relates to a method for detecting a resistive path to ground or a predetermined potential in electronic non-volatile memory devices that comprise at least one sectored array of memory cells.

2. Description of the Related Art

As it is well known, a faulty condition known as the "erase fail", on the occurrence of which at least one memory sector can no longer be erased, has grown to be a major problem with last-generation flash memories.

This faulty condition is determined by the way an erase operation, the so-called channel erasing, is carried out.

More particularly, it is known to erase all the cells of a whole sector of a flash memory array by applying a suitable voltage to the control terminals of the memory cells.

Figure 1:
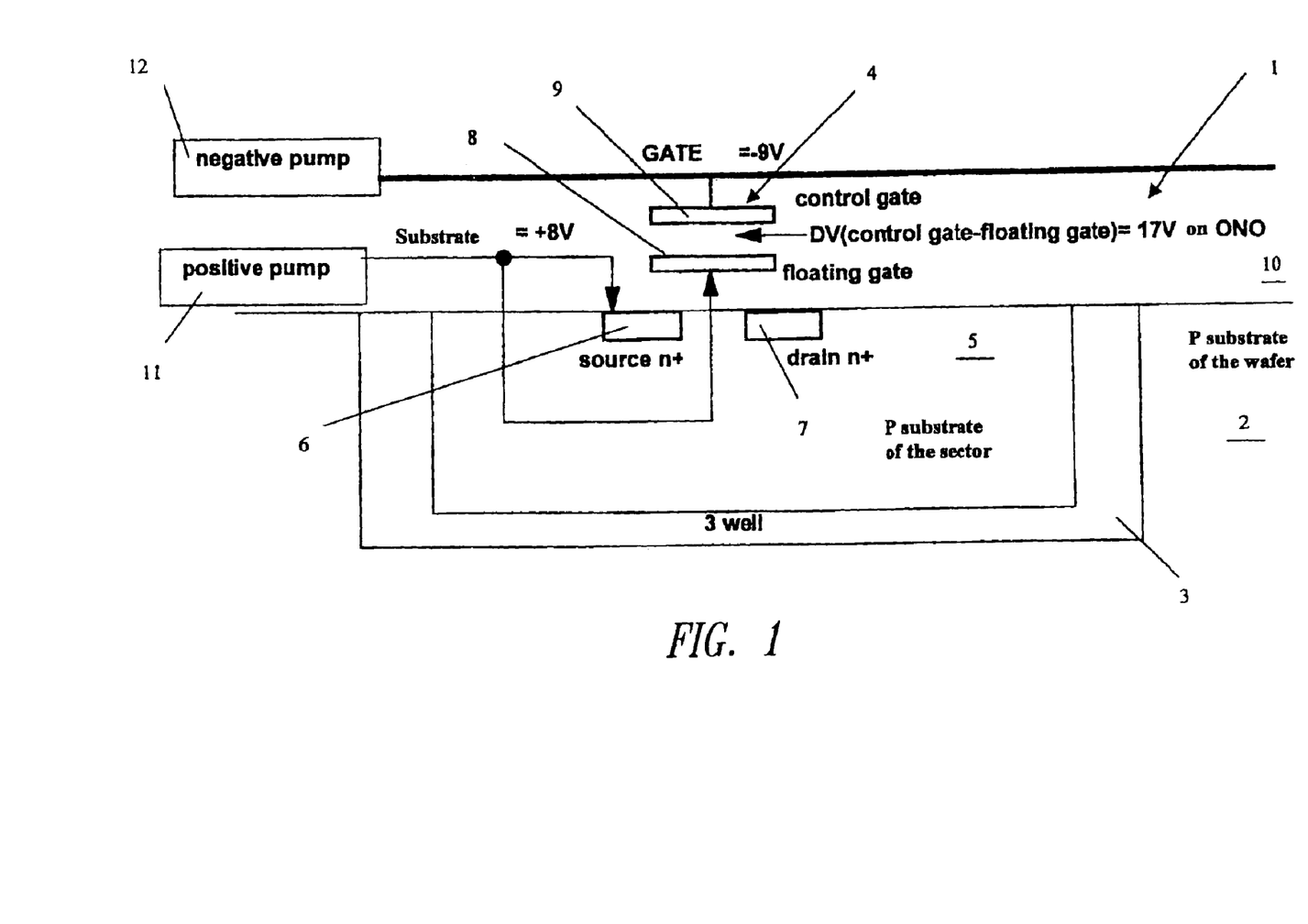
FIG. 1 schematically shows a portion of a semiconductor substrate where a non-volatile memory cell has been integrated according to the prior art.

FIG. 1 shows, schematically and to an enlarged scale, a portion of a semiconductor integrated circuit, which is fabricated conventionally to a flash memory cell 4. In particular, this portion 1 comprises a substrate 2 doped with a first dopant that may be of the P type. The substrate 2 serves the whole wafer where the portion 1 is also formed.

Preferably, a three-well structure, including an intermediate well 3 and an innermost well 5 in which the flash memory cell 4 is integrated, is preferably formed in the substrate 2.

Actually, all the cells 4 of a given sector of the flash memory array are formed in the innermost well 5. The well 5 is also doped with the first dopant of the P type, and a source region 6 and a drain region 7 of the cell 4 are formed towards its surface. These regions are islands of a second type of dopants that may be of the N type.

A thin layer of tunnel oxide separates the surface of the well 5 from a floating gate region 8, the latter being separated from a control gate region 9 by means of an isolation layer 10, which is usually an interpoly oxide 10, also called ONO layer.

The cell 4 is connected to first or positive and second or negative charge pump circuits 11 and 12, respectively.

During an erase operation, the innermost well 5 is applied a predetermined positive voltage value by means of the first or positive charge pump circuit 11. The value of this positive voltage usually reaches +8V, and is also applied to the floating gate region 8. The control gate region 9, on the other hand, is brought to a negative voltage value that reaches −9V by means of the second charge pump circuit 12.

In FIG. 1 this situation is schematically shown, in the form of paths illustrating the application of the above voltage values.

Figure 2:
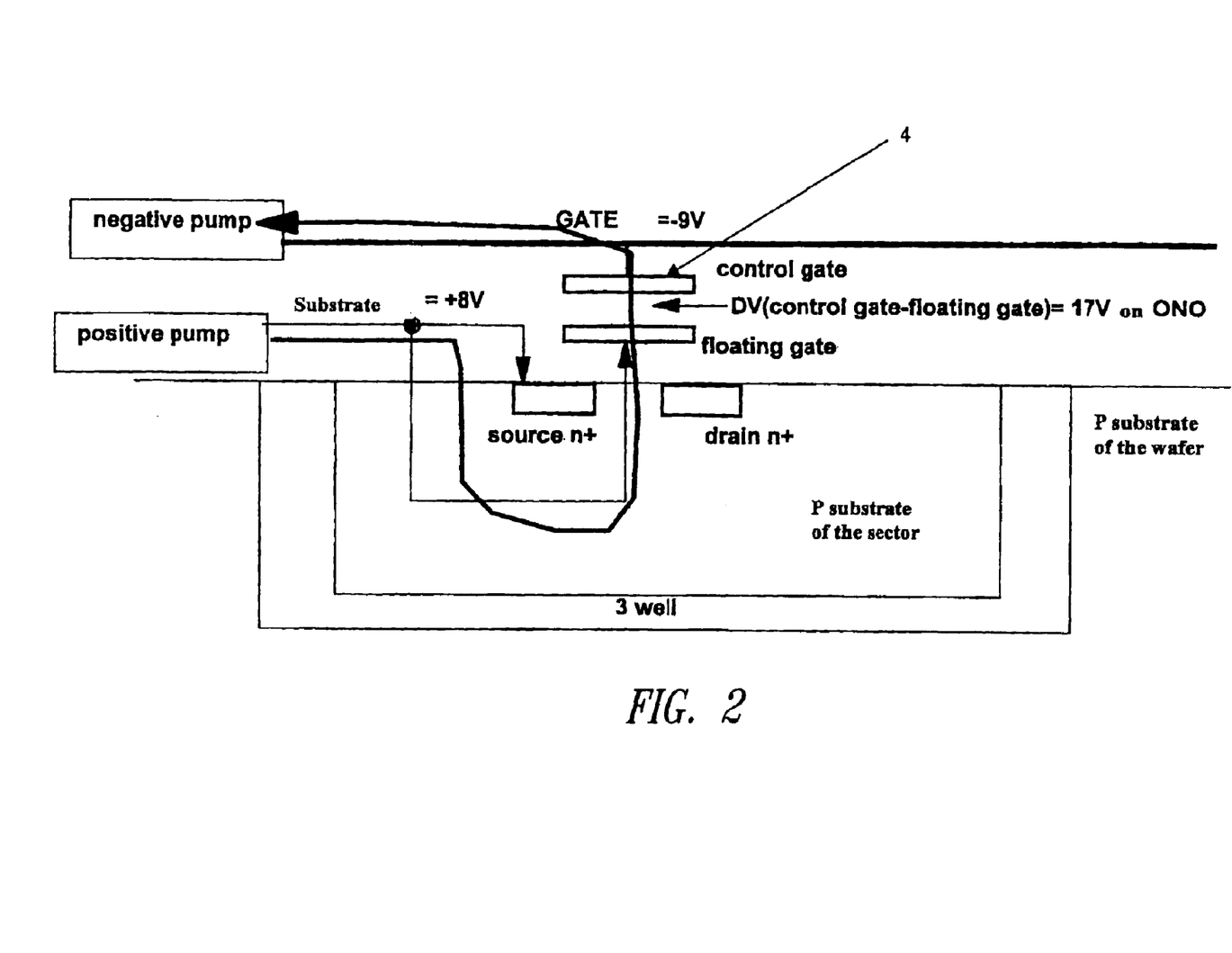
FIG. 2 schematically shows the same cell as in FIG. 1 and the fail condition, the so called erasing fault.

In this situation, the voltage across the interpoly oxide layer 10 may rise to a value equal to 17V and exceed it.

Where weak points occur in the structure of the interpoly oxide layer 10, the layer is apt to deteriorate and even to break. When it does, the second or negative charge pump circuit 12 becomes shorted to the first or positive charge pump circuit 11 while the cell 4 is erased, as indicated in FIG. 2 by the conduction path 13.

A net outcome is that one or more cells in the sector affected by the short-circuit in well 5 is not erased, thus bringing the memory to an erase-fail state.

The prior art already proposes a way to overcome this problem that consists of applying a field redundancy concept in the erase algorithm, with attendant sector redundancy.

More particularly, this prior proposal consists of replacing a failed memory element, or even a whole memory sector, with a new element. The erase algorithm is suitably modified, so to have the erase operation performed on the redundant sectors and not on the failed sectors anymore.

Furthermore, the redundancy operation would be available through the service life of a memory device on the market, as well as to the test procedures for factory testing memory devices before delivery.

In particular, in the course of an erase operation, a check phase is performed, which allows to divert the erase operation to a "sparing" sector in the event of sector failing and thus to properly erase such a sector.

Of course, this can only be accomplished if one or more redundant sectors are available to replace the failed ones. Thus, the main shortcoming of the above prior proposal is that each device must be equipped with a whole redundant sector even if only one cell in the failed sector actually requires replacement.

It should be noted in this respect that the average size of a flash memory sector is 1 Mbit, and that erase fails are frequent occurrences. Thus, it would be necessary to use a large number of sectors having large dimensions to effectively correct faulty devices. On the contrary, replacing memory cell sectors bodily is a comparatively simple matter, although heavily restrictive of circuit area: it is merely necessary to arrange for the address of a sector found failed to be "shifted" to a redundant sector each time that the failed sector is addressed.

Heretofore, the state of the art has provided no practical solution to the problem of readily detecting memory cells in an erase fail condition, this being a condition that may indeed occur during an erase phase and is largely unpredictable, with no simple way of detecting the failed cells.

BRIEF SUMMARY OF THE INVENTION

The underlying technical objective of this invention is to provide a method of erasing non-volatile memory cells, and a memory device implementing the method, with appropriate functional and constructional features.

The solution on which the present invention stands including locating any low resistance path to ground. In one embodiment, this may include an attempt to measure a resistive path to ground or a predetermined potential on a floating circuit node. A detection of this path or potential is indicative of the presence of a spurious current, such as would only show up in the event of a fault having occurred between the gate and body terminals of memory cells, this spurious current being useful to pinpoint the elements responsible for the fault condition. Thus, failed cells can be isolated from the remainder of a sector so that the redundance procedure can be aimed specifically at the failed cells.

Briefly, the invention provides a redundance feature that is aimed at each single sector rather than at the whole device.

Based on this idea, the technical problem is solved by a method as above indicated, and as defined in claim 1.

The problem is further solved by an integrated memory device of the type defined in claim 9.

The invention relates to a method of detecting failed memory cells in order to have their addresses recorded in redundance registers of electronic non-volatile memory devices, each memory device comprising at least one memory cell array or matrix organized in a row and column layout, and the memory array being associated with at least one row decode circuit portion per sector that is supplied positive and negative voltages, wherein the memory array sectors can be erased independently of one another by an erase algorithm.

For convenience of explanation only, the following description makes reference to this field of application.

Although not limited to, the invention relates to an electronic memory device, which is monolithically integrated in a semiconductor and comprises at least one array of non-volatile memory cells, such as the flash EEPROM cells considered here below by way of example.

The features and advantages of the method and the device according to the invention should become understood from the following description of embodiments thereof, given by way of example and not of limitation with reference to the accompanying drawings.

DETAILED DESCRIPTION OF THE INVENTION

First of all the mechanisms that cause an erase fail condition, shown with reference to the prior art, can be analyzed in detail in order to understand all the aspects of this invention.

An erase fail condition is caused by the negative charge pump circuit 12, arranged to energize the control gate region (hereinafter abbreviated to "gate region") of a failed memory cell 4, becoming shorted to the positive charge pump circuit 11 which is energizing the source region 6 of the cell and the common substrate 5 of all the cells in a sector.

With charge pump circuits of conventional design, the voltage used during erase operations can be maintained not even if the failure occurs just at one cell. The voltage values are those provided by the splitting effect caused by the short-circuit and are transferred to both the control gate regions of the cells in the same row as the failed cell and to the gate regions of the other cells in the same sector. However, these are insufficient voltages to produce the electric fields that are required in order to start the tunneling effect which would enable the erase operation to be performed.

Furthermore, even if charge pumps adapted to deliver all the current that is required without incurring voltage drops were made available, the same difficulty would be met during the program and read operations because a spurious current would still be there, between a gate terminal and a ground reference to which the substrate is connected. This spurious current acts in any case to lower the voltage of the gate region. This can cause the entire sector to fail.

According to the principles of the present invention, the expensive replacement of entire sectors as in the prior art is avoided. In one embodiment, this invention advantageously provides for redundant rows to be borne inside the memory device sector where a fail is likely to occur.

"Memory device" means here any monolithic electronic device that comprises an array of memory cells, laid into rows and columns, and circuit portions that are associated with the cell array to serve the functions of addressing, decoding, reading, writing, and erasing the contents of memory cells.

Such a device may be a sectored, electrically erasable non-volatile flash EEPROM chip integrated in a semiconductor.

Each memory cells would comprise a floating gate transistor having source, drain, and control gate terminals.

The circuit portions that are associated with the cell array include a row decode circuit portion, which is associated with each of the sectors and supplied by specified positive and negative voltages, being generated within the integrated memory circuit by voltage boosters or charge pumps and regulated by respective voltage regulators.

The teachings of this invention apply to an integrated memory device, wherein the array sectors can be erased independently of one another by means of an erase algorithm. The invention can correct a fail condition of even a single cell in one sector, by providing a local redundancy for each sector.

More particularly, the invention "suppresses" the spurious current caused by a failed cell that would also harm intact cells in the same sector.

Advantageously in this invention, the contribution from said spurious current is cancelled by a modified row decode structure provided within the non-volatile memory device.

Figure 3:
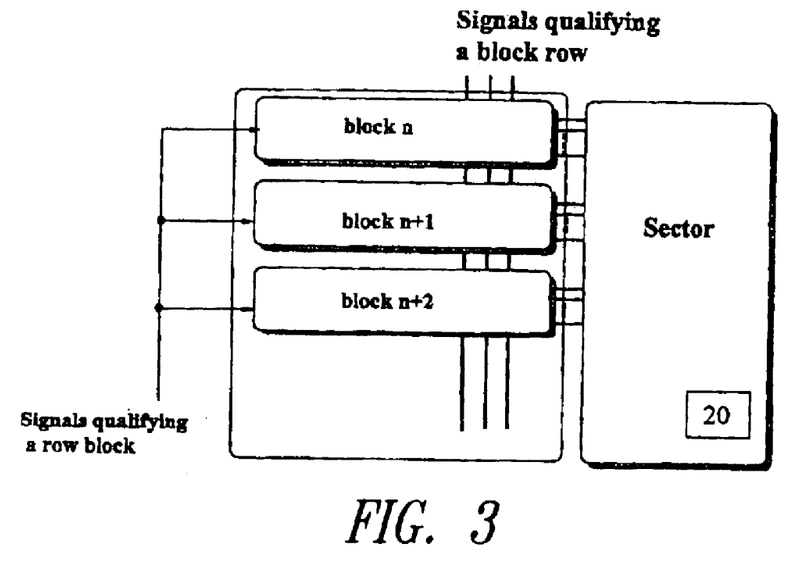
FIG. 3 schematically shows the row decode arrangement in an integrated non-volatile memory device according to the prior art.

In many memories, the row decode feature is obtained by having a basic decode block, associated with a memory cell array sector, replicated $\underline{n}$ times; some addresses will enable a given block, and others will enable a row within the given selected block. This pre-encoding and decoding procedure allows a huge number of rows to be addressed by using a few signals. This structural scheme is illustrated in FIG. 3.

Figure 4:
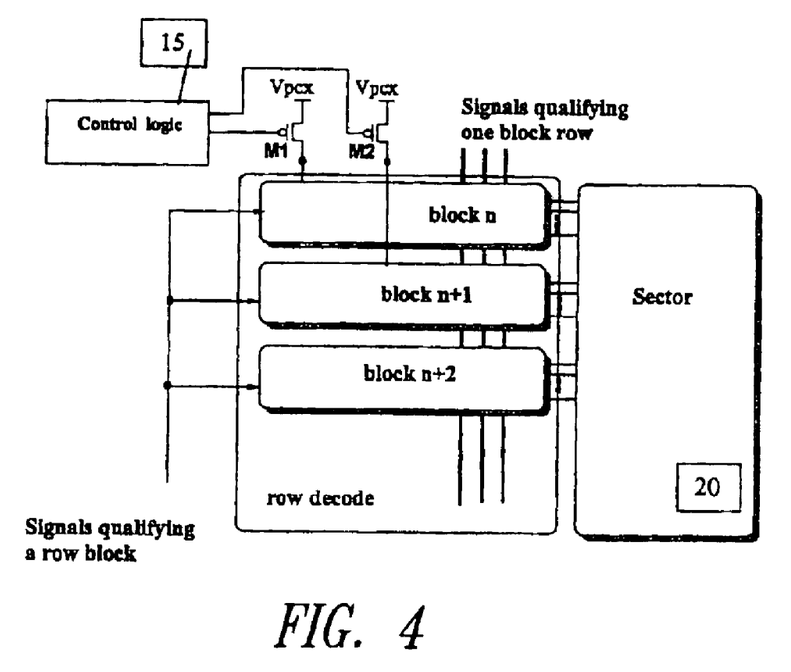
FIG. 4 schematically shows a detail of the row decode arrangement in an integrated non-volatile memory device according to the invention.

To suppress the spurious current, the invention employs at least one switch placed between the power supply and the decode blocks, as shown in FIG. 4.

While only a first switch M1 and a second switch M2 are shown in FIG. 4, which are connected between the positive supply Vpcx and the first two of the decode blocks, a separate switch between the power supply and each decode block would be preferable.

Several different constructions are viable for the switches, although simple MOS transistors, in particular NMOS transistors, are preferred.

Thus the positive supply Vpcx for reading and programming can be disconnected from a row block, in particular a row block that contains a failed cell.

Control logic 15 is arranged to control the transistor switches. The logic 15 is operatively interlinked with the contents of redundancy registers. The redundancy registers store the addresses of the failed rows and thus this information is provided to the control logic as to which rows to disconnect from the power supply.

This solution does not totally solve the erase problem, but it allows a row block containing a failed cell to be pinpointed during read and program operations.

To segregate the row block that contains a failed cell, a switch could be also provided in the conduction path from the negative voltage to the array rows, while still going through the row decode. In one embodiment, this is an NMOS transistor as customarily provided in the final stage of a so-called row driver.

For this purpose, an additional switch is provided within the row decode blocks.

Figure 5:
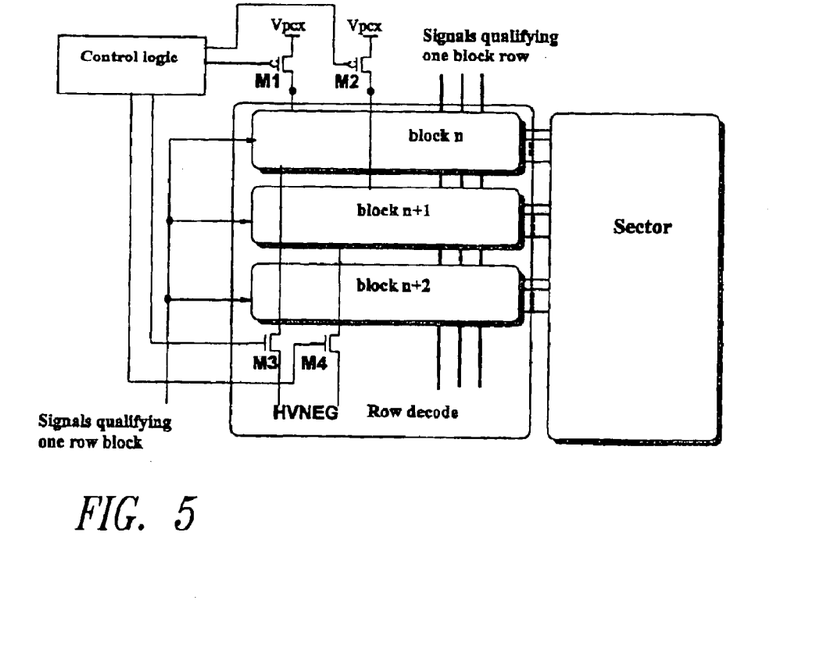
FIG. 5 schematically shows another detail of a row decode arrangement according to the invention.

Shown in FIG. 5 is an embodiment of the above arrangement where a switch M3 in block $\underline{n}$ and a switch M4 in block (n+1) are provided.

Also in this case, although the switches can be made with different constructions, simple MOS transistors, specifically NMOS transistors, are preferred.

The switches M3, M4 are inserted in a conduction path through which the first and second decode blocks can be applied a negative voltage HVNEG for the purpose of cutting off the row block that contains a failed cell each time that the sector where the failed cell locates is addressed. These switches M3, M4 are controlled by the logic 15 interlinked to the redundancy registers.

The switches provided, M3 or M4, allow a row associated with a given sector to be set to float during operations that make use of the source and gate terminals of a given cell.

Figure 6:
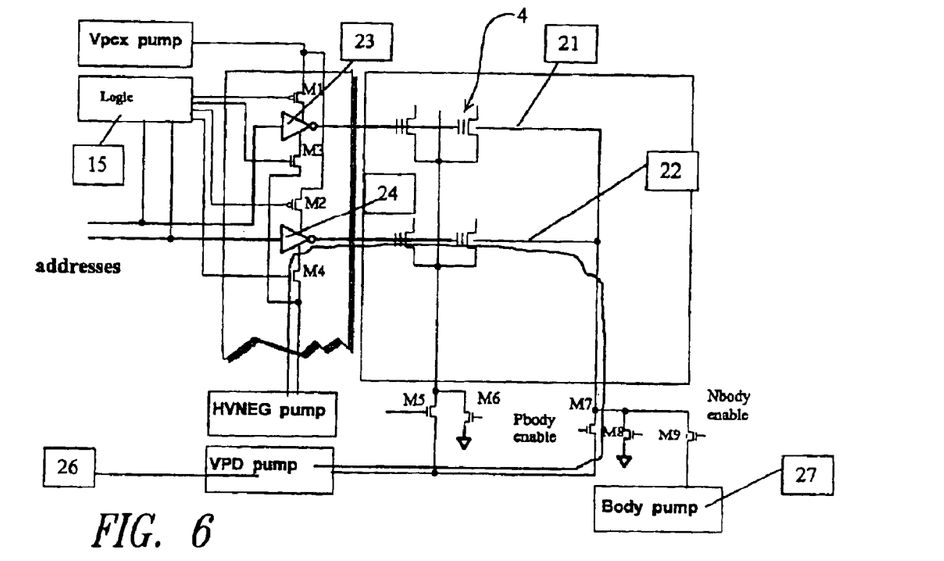
FIG. 6 shows a detailed view of the memory device according to the invention, shown at one stage of its operation.

FIG. 6 shows in greater detail the general circuit layout that would be called to work in an erase operation.

One sector 20 is shown there for simplicity, which contains four cells 4 located in two rows 21, 22, and associated final drivers 23, 24 of the same rows.

Transistors M1 and M2 are switches connected between the positive supply voltage Vpcx, which voltage would be taken to a row of memory array sector 20 during cell read and program operations. Transistors M3 and M4 are switches connected between the negative voltage supply HVNEG, this voltage being taken to the same row of the array sector 20 during an erase operation. The row is applied ground voltage during the read and program operations.

FIG. 6 also shows a VPD positive charge pump 26 arranged to take a positive voltage to the source and substrate regions 6 and 5 of the cell 4. The substrate and source voltages of the cell 4 can be made unrelated to each other since, during the program operation, the body region can be brought to a negative potential, while the source is held to ground. This increases programming efficiency.

An enable transistor M5 is connected in a conduction path that connects the pump 26 to the source regions 6, and an enable transistor M7 is inserted in a conduction path that connects the pump 26 to the body regions.

The possible negative voltage is supplied over another conduction path that includes an enable transistor M9, as shown in FIG. 6. A negative voltage charge pump 27 is specifically provided for the body regions.

As shown in FIG. 6, assuming the failed cell to locate in row 24, a possible fail condition would short the supply charge pump HVNEG to the positive voltage charge pump VPD through transistors M4, M5 and M7.

Figure 7:
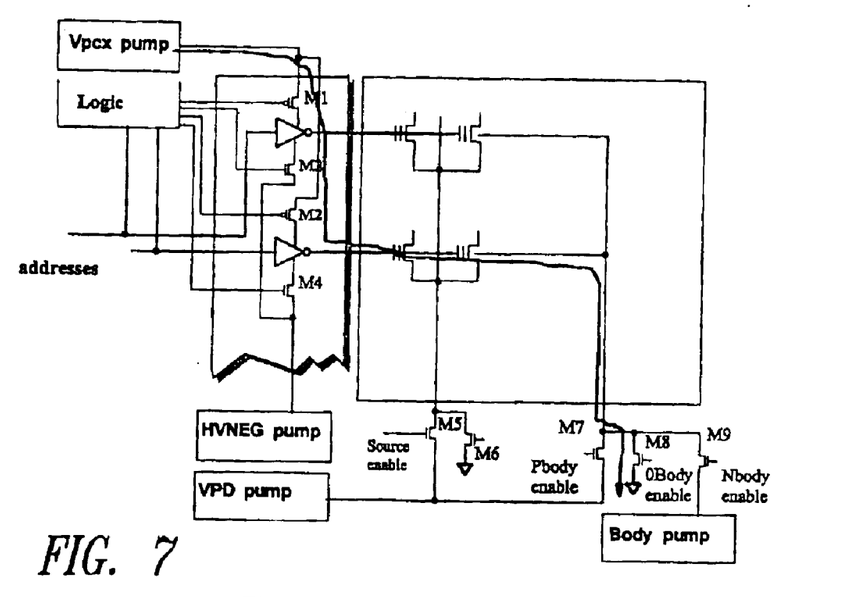
FIG. 7 shows a detailed view of the memory device according to the invention, shown at another stage of its operation.

Likewise, a discharge path is activated between the positive supply pump Vpcx to the gates and the substrate 5, as shown in FIG. 7.

Figure 8:
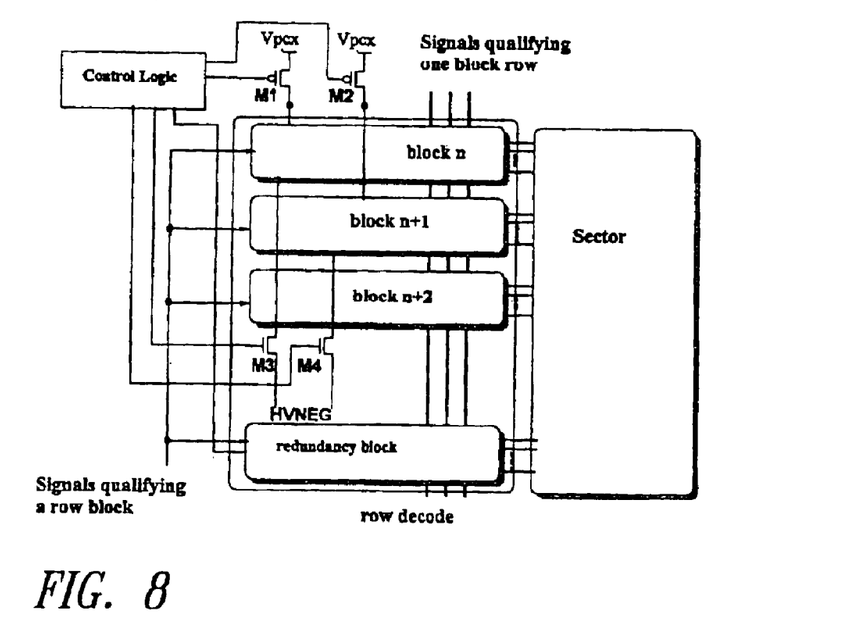
FIG. 8 schematically shows an embodiment of a row decode arrangement according to the invention.

Thus, according to this invention, in order to suppress the spurious current contribution, the row that contains a failed cell, e.g., row 24, is placed into a floating state. This is achieved by driving the switches M1, M2 by means of the redundancy register signals that are associated with the positive supply VPCX, as well as the switches M3, M4 that are associated with the negative supply HVNEG and belonging to blocks of rows placed inside one sector. Concurrently therewith, the corresponding switches of a redundant row block provided inside one sector 20 and associated with a respective decode block 28, as shown in FIG. 8, are enabled.

An explanation of how a failed state is detected, and the location of the failed cell in a sector found out in order to correct the situation by the method of this invention will now be provided.

To identify the row that contains the failed cell and have the failed cell address recorded in the redundancy registers, the faulty row must be first singled out. This complication is the price to be paid in order to have only one part of the sector replaced.

This operation would be unnecessary in case the whole sector were replaced. If an erase operation is completely unsuccessful, the whole sector might have to be replaced with a redundant sector, as conventionally done in the art.

According to this invention, the presence of a resistive path to ground or a lower potential is detected on a circuit node that is set floating there.

This node has a high capacitance to the same ground point as is making the current flow difficult to detect due to this capacitance slowing down the process of recognizing the current flowing through the resistive path.

In fact, in any such path including only one capacitor, the capacitor charging current is bound to be present and apt to be merged to a resistive current at startup.

Therefore, for current operation, a very long time filter would have to be provided. The inventive method overcomes the problem by arranging for the corresponding voltage to be monitored.

Since a fail condition is due to at least one cell causing a short circuit between the gate region and the substrate, a spurious current can be detected across the gate and body terminals of the failed cell. This spurious current would not be present in the memory device under normal conditions; in fact, the node of the array row is a purely capacitive node with no currents to other points when the row contains only sound cells (actually, each row exhibits a resistance of a few kiloOhms).

The failed cell, or merely the failed row, can be recognized by detecting this current.

Figure 9:
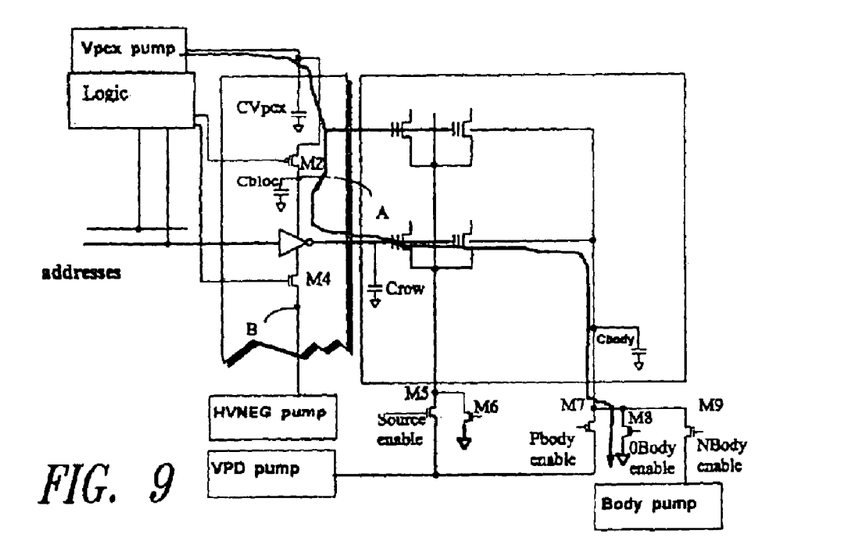
FIG. 9 shows a detailed view of the memory device according to the invention, shown at said another stage of its operation, but with an indication of parasitic capacitance.

A preferred procedure is that of using the memory device to force the sector that has not been fully erased into a read state; in this way the sector rows are scanned and the path shown in FIGS. 7 and 9 checked for the presence of a current through it.

Compared with FIG. 7, some components are omitted from, and major parasitic capacitances shown, in FIG. 9. These parasitic capacitances are itemized here below as:

Crow, a row capacitance on the order of a picoFarad;

Cvpcx, the capacitance of a whole row decode, on the order of 100 pF;

Cbloc, the capacitance of a row block; if each block has eight rows, for example, this capacitance may amount to 1 pF;

Cbody, the capacitance of the sector substrate node located in a fully isolated well during channel erasing; this capacitance is on the order of a nanoFarad.

Under these conditions, the spurious current detection should take capacitance Cbody into account. Because of its size, this capacitance, which would normally be held to ground by an associated enable transistor M8, behaves like a short on the current transient.

If the row that contains a failed cell were addressed, a heavy current would fill the parasitic capacitor Cbody within a time 1 us, when 10 mA is available and it must be charged at no more than 1 V. Of course, the charge voltage of the capacitor would be also dependent on the resistance between the supply Vpcx and the body region. In addition, the charge current sought would not be available because the pump Vpcx is current limited.

Accordingly, two are the possible occurring cases: waiting for a long time or no significant current can be detected through M8.

It would be necessary to detect a current variation through transistor M3, tantamount to picking up a voltage at node A and comparing it with a reference value to detect whether the current in question is a regular or a spurious current, indicating a failed state.

However, in this case it would be necessary to pick up the voltage at node A for each set of rows, by expanding the row decoding capacity that could be excessive during the reading phase.

Thus, picking up a voltage potential at node B, between switch M4 and the respective negative supply, is preferable. This node is ineffectual on the read path capacity, so that a potential can be picked up for each row block.

Actually, the node from which the potential for detecting the spurious current must be picked up is easily found, because the source regions of the transistor switches associated with the negative supply all focus on the HVNEG block. It could be thought, therefore, of replicating the structure of each sector.

Figure 10:
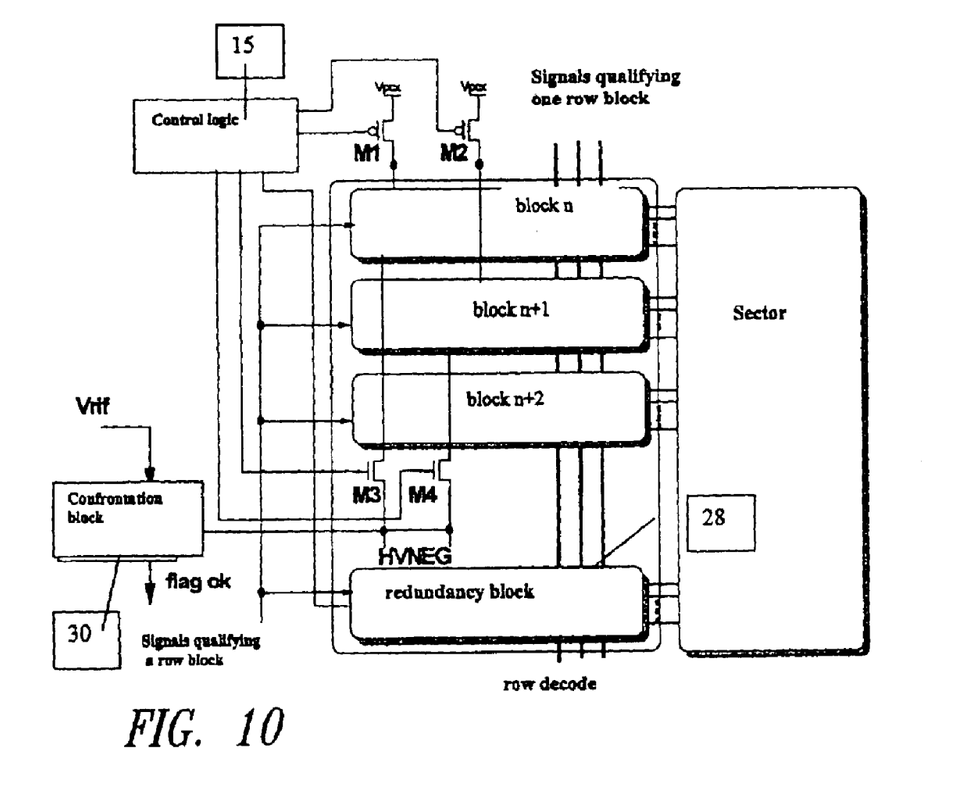
FIG. 10 shows a general view of the row decode embodiment shown in FIG. 8.

A compare block 30, shown in FIG. 10, picks up the voltage at node B, this being the voltage at the row start, and monitors its rise curve. If a spurious current exists the row will tend to rise, thus revealing the presence of the spurious current.

The compare block 30 is input a reference signal Vrif from a redundant row or dummy row, known to be operative. This signal is obtained simply by duplicating the affected path with a set of rows that is never erased and never could have potentials such to originate the fault.

Figure 11:
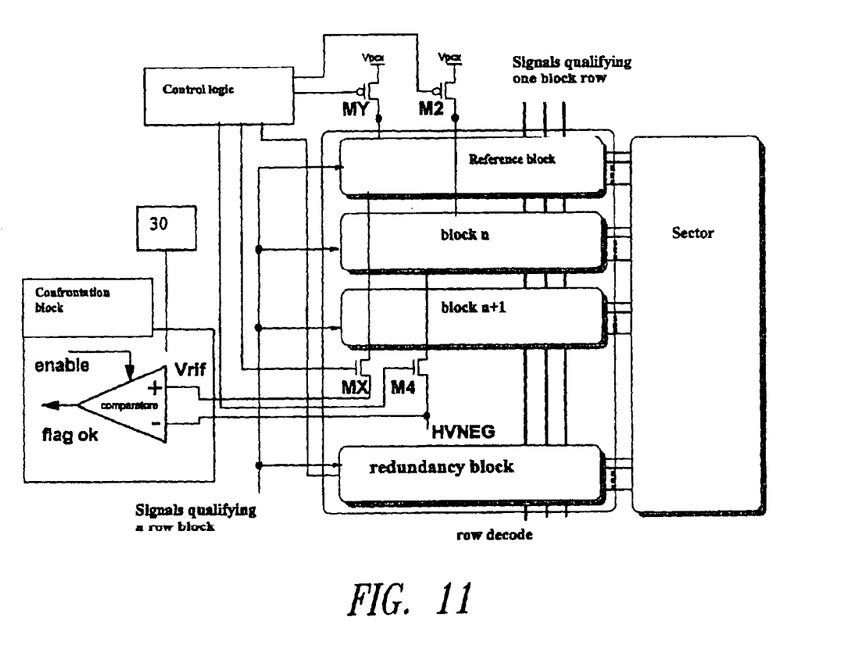
FIG. 11 schematically shows a structurally detailed view of the row decode embodiment shown in FIG. 8.

The inner structure of block 30 is shown in detail in FIG. 11. This block includes a comparator and illustrates the general architecture for row decoding of this invention.

Figure 12:
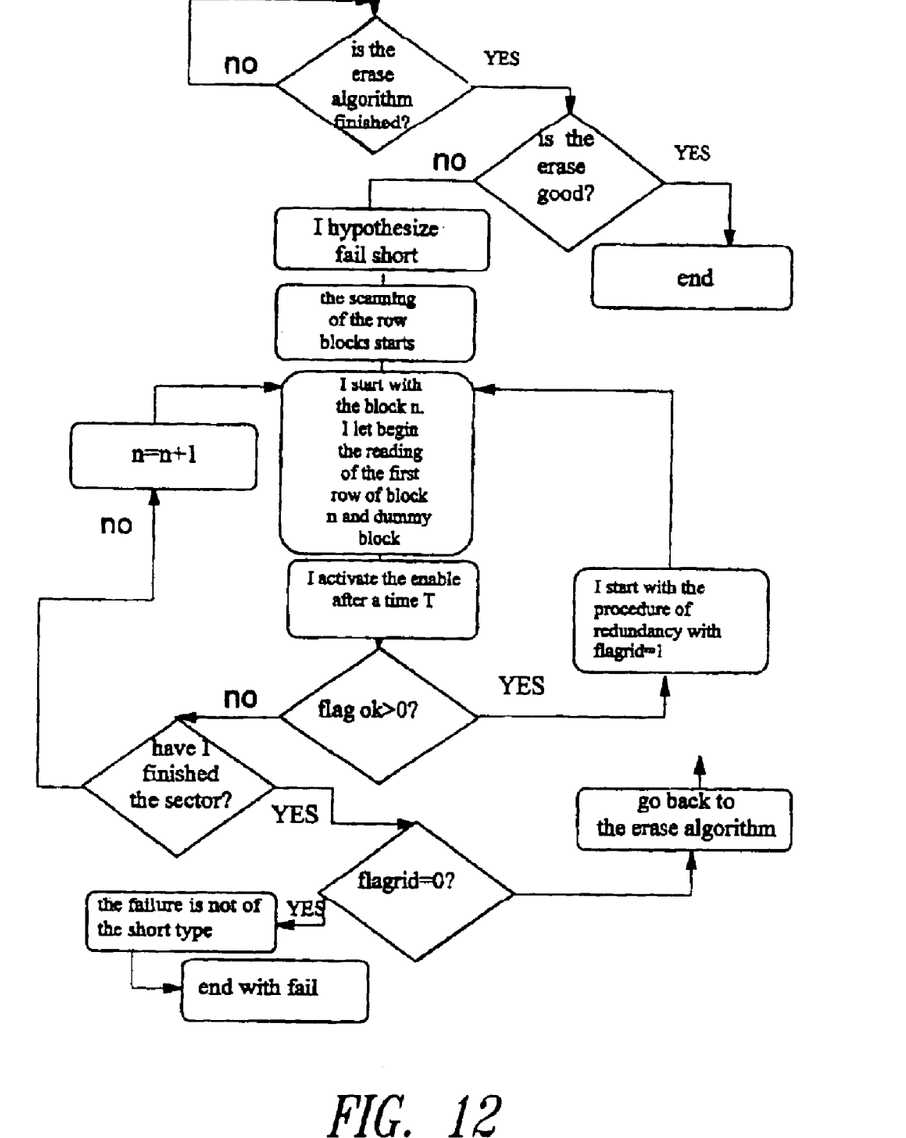
FIG. 12 is a flow chart showing the main operations performed by the memory cell erasing method according to the invention.

The flow chart of FIG. 12 schematically shows the main steps of the erasing method of this invention.

If at the end of the erase operation such an operation is unsuccessful, a fail situation of the above described short-circuit type may exist. Of course, the failure might be more serious and extensive than that and not remediable by this invention.

Where the fault can be corrected, the read algorithm is started in order to scan the row blocks in the estimated failed sector. Concurrently therewith, each time that a row block is addressed, a dummy row block will also be addressed, and after a time T of about a few tens nanoseconds (the time required for the row to become charged), a comparison of the two nodes in block 30 can be performed. The node of the redundancy dummy row will be the same value as the supply Vpcx, but the node of the addressed row in the addressed block 20 is bound to be a different value because of the spurious current.

If the signal "flagok" is positive, then a failure has occurred. The replacement algorithm "on line" of the row block is then started to activate a redundant row.

One or more redundant rows are provided close to the rows in the sector, preferably within each sector in one embodiment, or in a location adjacent to the sector, within a threshold distance, so they can easily be provided to replace a row in a sector.

Thereafter, the remaining rows will be analyzed because the possibility of multiple failures cannot be ruled out.

In the other case, the search is maintained to the sector end. On completion of the analysis, the position of the redundancy flag tells whether the operation has been successful.

Of course, the erase algorithm is now to be re-started, and this may require more time than a device without failed rows would require.

This longer erase time is a small trade-off of the benefit of the inventive teachings: the savings in redundancy circuit area and the ability to restore a failed device to normal operation make the increased erase time of trivial consideration.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of detecting a resistive path or a predetermined potential in electronic non-volatile memory devices that comprise at least one array or matrix of memory cells arranged in sectors organized in rows and columns, said sectors being adapted to be erased independently from each other by an erase algorithm, and said memory array being associated with at least one row-decoding circuit portion per sector, each said portion being supplied positive and negative voltages, characterized by:

forcing a read condition onto any incompletely erased sector;

scanning the rows of said sector to check the possible presence of a spurious current;

finding a row where said spurious current flows and electrically isolating it by re-addressing said row to a redundant row provided in the same sector.

2. A method according to claim 1, characterized in that said reading condition is forced whenever the issue of the erase algorithm is incomplete or negative.

3. A method according to claim 1, characterized in that the rows of a given sector are scanned, also checking the possible presence of said spurious discharge current in a conduction path leading to a positive power supply.

4. A method according to claim 1, characterized in that at least one switch is provided between each one of the decode blocks and respective positive and negative power supplies in order to isolate the failed row.

5. A method according to claim 1, characterized in that said re-addressing is effected by means of a redundance decode block incorporated inside the row-decoding circuitry.

6. A method according to claim 4, characterized in that said switches are driven by a logic operatively interlinked to the contents of redundance registers.

7. A method according to claim 3, characterized in that said spurious current is detected by comparison of a row node with a redundance node.

8. A method according to claim 7, characterized in that said comparison is performed by a compare block, that is input a reference signal produced from a redundant row and a row signal taken at the beginning of a row being scanned.

9. A method according to claim 1, characterized in the erase algorithm is re-started after the failed row is identified and electrically isolated.

10. A method according to claim 1, characterized in that the presence of said spurious current indicates at least one memory cell in an erase-fail state.

11. An integrated non-volatile memory device of the programmable and electrically erasable type, comprising a sectored array of memory cells arranged in rows and columns, with at least one row decode circuit portion per sector being supplied positive and negative voltages, characterized in that it comprises a redundant-row block within each sector and a compare block being input a reference signal from a redundant row and a row signal taken at one end of a row of the array being read.

12. A device according to claim 11, characterized in that it comprises:

a plurality of row decode blocks and at least one redundance decode block within the decoding circuitry;

between each one of the decode blocks and the respective positive and negative supplies, at least one switch for, in the course of erase, read or program operations, isolating and relating to a redundant one even a single block having at least one row with a failed cell.

13. A device according to claim 11, characterized in that said switches comprise MOS transistors.

14. A device according to claim 11, characterized in that it includes a control logic for controlling said switches.

15. A device according to claim 14, characterized in that the operation of said logic is interlinked to the contents of redundance registers.

* * * * *